US012685040B2

(12) United States Patent
Sakai et al.

(10) Patent No.: US 12,685,040 B2
(45) Date of Patent: Jul. 14, 2026

(54) GROUP-III ELEMENT NITRIDE SEMICONDUCTOR SUBSTRATE

(71) Applicant: NGK INSULATORS, LTD., Nagoya (JP)

(72) Inventors: Masahiro Sakai, Nagoya (JP); Katsuhiro Imai, Nagoya (JP); Hiroki Kobayashi, Chiryu (JP)

(73) Assignee: NGK INSULATORS, LTD., Nagoya (JP)

( * ) Notice: Subject to any disclaimer, the term of this patent is extended or adjusted under 35 U.S.C. 154(b) by 308 days.

(21) Appl. No.: 18/451,934

(22) Filed: Aug. 18, 2023

(65) Prior Publication Data

US 2023/0395373 A1 Dec. 7, 2023

Related U.S. Application Data

(63) Continuation of application No. PCT/JP2021/042574, filed on Nov. 19, 2021.

(30) Foreign Application Priority Data

Mar. 25, 2021 (JP) ................................ 2021-051046

(51) Int. Cl.
| | |
|---|---|
| *H10D 62/85* | (2025.01) |
| *H10D 62/40* | (2025.01) |
| *H10H 20/01* | (2025.01) |
| *H10H 20/818* | (2025.01) |
| *H10H 20/825* | (2025.01) |
| *H10P 14/20* | (2026.01) |

(52) U.S. Cl.
CPC ....... *H10P 14/2908* (2026.01); *H10D 62/405* (2025.01); *H10D 62/8503* (2025.01); *H10H 20/0137* (2025.01); *H10H 20/818* (2025.01); *H10H 20/825* (2025.01); *H10P 14/2926* (2026.01)

(58) Field of Classification Search
CPC ........ H01L 21/02389; H01L 21/02433; H10D 62/405; H10D 62/8503; H10H 20/0137; H10H 20/818; H10H 20/825; C30B 9/10; C30B 29/406
See application file for complete search history.

(56) References Cited

U.S. PATENT DOCUMENTS

| | | | |
|---|---|---|---|
| 6,413,627 B1 | 7/2002 | Motoki et al. | |
| 7,229,926 B2 | 6/2007 | Matsumoto | |

(Continued)

FOREIGN PATENT DOCUMENTS

| | | |
|---|---|---|
| CN | 101339926 A | 1/2009 |
| JP | 2000-22212 A | 1/2000 |

(Continued)

OTHER PUBLICATIONS

English Translation of the International Preliminary Report on Patentability, issued in corresponding International Application No. PCT/JP2021/042574, Date of Mailing Oct. 5, 2023 (6 pages).

(Continued)

*Primary Examiner* — David Vu
(74) *Attorney, Agent, or Firm* — FLYNN THIEL, P.C.

(57) ABSTRACT

A Group-III element nitride semiconductor substrate includes: a first surface; and a second surface, wherein warping of a crystal plane of the first surface has a plurality of extremes.

7 Claims, 5 Drawing Sheets

(56)          References Cited

U.S. PATENT DOCUMENTS

| | | | | |
|---|---|---|---|---|
| 11,970,784 | B2 * | 4/2024 | Yoshida | ............ H01L 21/02458 |
| 2005/0093101 | A1 | 5/2005 | Matsumoto | |
| 2010/0300423 | A1 | 12/2010 | Oshima | |
| 2017/0345694 | A1 | 11/2017 | Hayashi et al. | |
| 2019/0157509 | A1 | 5/2019 | Tashiro et al. | |
| 2021/0317597 | A1 | 10/2021 | Yoshida | |

FOREIGN PATENT DOCUMENTS

| | | | |
|---|---|---|---|
| JP | 2005-136167 | A | 5/2005 |
| JP | 5244628 | B2 | 8/2010 |
| JP | 2011-9700 | A | 1/2011 |
| JP | 2017210396 | A | 11/2017 |
| JP | 202033212 | A | 3/2020 |
| JP | 2021-8399 | A | 1/2021 |

OTHER PUBLICATIONS

International Search Report, with English translation, issued in corresponding International Application No. PCT/JP2021/042574, date of mailing Dec. 28, 2021 (5 pages).

Written Opinion of International Searching Authority issued in corresponding International Application No. PCT/JP2021/042574, date of mailing Dec. 28, 2021 (4 pages).

German Office Action with English translation issued in corresponding German Application No. 11 2021 006 806.7, mailed Apr. 23, 2025 (13 pages).

Notice of Reasons for Refusal, with English translation, issued in corresponding Japanese Application No. 2023-508455 dated Dec. 9, 2025 (8 pages).

Chinese Office Action with English translation issued in corresponding Chinese Application No. 202180093245.1 dated May 9, 2026 (16 pages).

\* cited by examiner

GROUP-III ELEMENT NITRIDE SEMICONDUCTOR SUBSTRATE

CROSS-REFERENCE TO RELATED APPLICATIONS

This application is a continuation under 35 U.S.C. 120 of International Application PCT/JP2021/042574 having the International Filing Date of 19 Nov. 2021 and having the benefit of the earlier filing date of Japanese Application No. 2021-051046, filed on 25 Mar. 2021. Each of the identified applications is fully incorporated herein by reference.

BACKGROUND OF THE INVENTION

1. Field of the Invention

The present invention relates to a Group-III element nitride semiconductor substrate.

2. Description of the Related Art

Group-III element nitride semiconductor substrates, such as a gallium nitride (GaN) wafer, an aluminum nitride (AlN) wafer, and an indium nitride (InN) wafer, have been used as the substrates of various semiconductor devices.

A semiconductor substrate includes a first surface and a second surface. When the first surface is defined as a main surface, and the second surface is defined as a back surface, the main surface is typically a Group-III element polar surface, and the back surface is typically a nitrogen polar surface. An epitaxial crystal may be grown on the main surface, and various devices may be produced thereon.

Specifically, for example, it is known that a freestanding substrate formed of a Group-III element nitride is obtained by growing and forming a Group-III element nitride layer on a base substrate such as a sapphire substrate, and separating the base substrate by a laser lift-off (LLO) technology or the like. A light-emitting element, such as an LED or an LD, or a power device is produced by forming a functional layer of GaN, AlGaN, InGaN, or the like on such freestanding substrate. Recently, a base substrate having a large diameter of 4 inches or 6 inches has been increasingly required in an ultra-high brightness LED or a power device.

However, in general, after the Group-III element nitride layer has been peeled from the base substrate, the Group-III element nitride layer is warped owing to, for example, a stress distribution inside a Group-III element nitride crystal, and a dislocation density difference between the front and back of the Group-III element nitride layer.

In view of the foregoing, when a substrate having a warped contour shape is subjected to flattening processing in the production of the Group-III element nitride semiconductor substrate, the flattening processing causes warping in a crystal plane, forming a region in which a crystal direction of the surface of the substrate, which is called an off angle, is shifted from an intended crystal direction. In addition, the extent of the shift increases with increased closeness to the outer peripheral portion of the substrate, and hence an off-angle variation is generated (Patent Literature 1).

When the off-angle variation in the Group-III element nitride semiconductor substrate is large, the surface morphology of the functional layer to be formed on the Group-III element nitride semiconductor substrate is roughened, or its function fluctuates from place to place as a consequence.

For example, in the case of a light-emitting device, there occurs a problem in that a wavelength variation in the substrate is increased.

CITATION LIST

Patent Literature

[PTL 1] JP 2000-22212 A

SUMMARY OF THE INVENTION

An object of the present invention is to provide a Group-III element nitride semiconductor substrate having a small off-angle variation.

A Group-III element nitride semiconductor substrate according to an embodiment of the present invention includes: a first surface; and a second surface, wherein warping of a crystal plane of the first surface has a plurality of extremes.

In one embodiment, warping of a crystal plane in a <11-20> direction passing through a center of the substrate in the crystal plane of the first surface, and warping of a crystal plane in a <1-100> direction perpendicular to the <11-20> direction and passing through the center of the substrate each have a plurality of extremes.

In one embodiment, a number of the extremes is 3 or more.

In one embodiment, the extremes have an interval of 3 mm or more between adjacent extremes.

In one embodiment, an off-angle variation of the Group-III element nitride semiconductor substrate as a whole is 0.40° or less.

In one embodiment, the Group-III element nitride semiconductor substrate has a diameter of 75 mm or more.

According to the present invention, the Group-III element nitride semiconductor substrate having a small off-angle variation can be provided.

DESCRIPTION OF THE EMBODIMENTS

Figure 1:
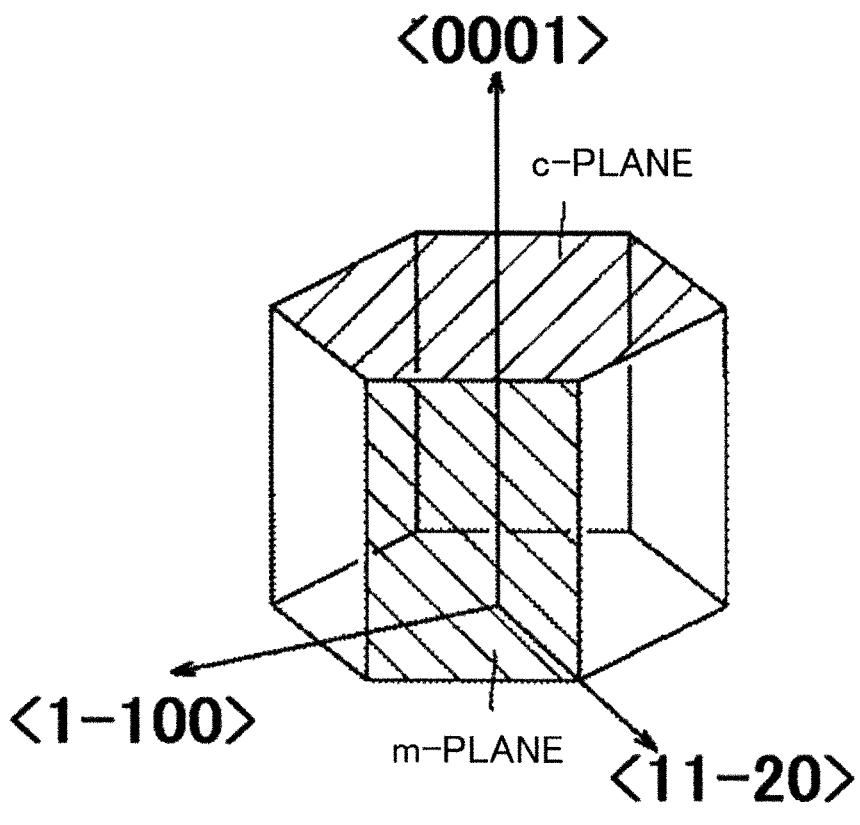
FIG. 1 is a schematic explanatory view for illustrating plane directions and crystal planes in the crystal structure of a Group-III element nitride semiconductor substrate according to an embodiment of the present invention.

When the expression "weight" is used herein, the expression may be replaced with "mass" that is commonly used as an SI unit representing a weight.

A Group-III element nitride semiconductor substrate according to an embodiment of the present invention is typically a freestanding substrate formed of a Group-III element nitride crystal. In the description of the present invention, the term "freestanding substrate" means a substrate that is not deformed or broken by its own weight at the time of its handling, and hence can be handled as a solid. The freestanding substrate may be used as each of the substrates of various semiconductor devices, such as a light-emitting device and a power-controlling device.

The Group-III element nitride semiconductor substrate according to the embodiment of the present invention typically has a wafer shape (substantially complete round shape). However, the substrate may be processed into any other shape such as a rectangular shape as required.

Any appropriate diameter may be adopted as the diameter of the Group-III element nitride semiconductor substrate according to the embodiment of the present invention to the extent that the effect of the present invention is not impaired. Such diameter is, for example, 50 mm or more. The diameter of the Group-III element nitride semiconductor substrate according to the embodiment of the present invention is preferably 75 mm or more, more preferably 100 mm or more because the effect of the present invention can be expressed to a larger extent. Particularly when the Group-III element nitride semiconductor substrate according to the embodiment of the present invention is a so-called large-diameter Group-III element nitride semiconductor substrate having a diameter of 75 mm or more, the Group-III element nitride semiconductor substrate according to the embodiment of the present invention is easily applied to a high-frequency/high-power electronic device, particularly to such a device for handling large electric power as to entail an increase in element size.

Specific examples of the large-diameter Group-III element nitride semiconductor substrate include a 4-inch wafer, a 6-inch wafer, an 8-inch wafer, and a 12-inch wafer.

The thickness of the Group-III element nitride semiconductor substrate according to the embodiment of the present invention (when the thickness is not constant, the thickness of a site having the largest thickness) is preferably from 300 μm to 1,000 μm.

Typical examples of the Group-III element nitride include gallium nitride (GaN), aluminum nitride (AlN), indium nitride (InN), and a mixed crystal thereof. Those nitrides may be used alone or in combination thereof.

The Group-III element nitride is specifically GaN, AlN, InN, $Ga_xAl_{1-x}N$ (1>x>0), $Ga_xIn_{1-x}N$ (1>x>0), $Al_xIn_{1-x}N$ (1>x>0), or $Ga_xAl_yIn_zN$ (1>x>0, 1>y>0, x+y+z=1). Those nitrides may be doped with various n-type dopants or p-type dopants.

Typical examples of the p-type dopant include beryllium (Be), magnesium (Mg), strontium (Sr), and cadmium (Cd). Those dopants may be used alone or in combination thereof.

Typical examples of the n-type dopant include silicon (Si), germanium (Ge), tin (Sn), and oxygen (O). Those dopants may be used alone or in combination thereof.

The Group-III element nitride semiconductor substrate according to the embodiment of the present invention is a Group-III element nitride semiconductor substrate including a first surface and a second surface. When the first surface is defined as a main surface, and the second surface is defined as a back surface, as long as the plane direction of the Group-III element nitride semiconductor substrate is on the c-plane side, the main surface is typically a Group-III element polar surface, and the back surface is typically a nitrogen polar surface. However, the main surface may be set to the nitrogen polar surface, and the back surface may be set to the Group-III element polar surface. An epitaxial crystal may be grown on the main surface, and various devices may be produced thereon. The back surface may be held with a susceptor or the like to transfer the Group-III element nitride semiconductor substrate according to the embodiment of the present invention.

In the description of the Group-III element nitride semiconductor substrate according to the embodiment of the present invention, the first surface is described as the main surface, and the second surface is described as the back surface. Accordingly, in this description, the term "main surface" may be replaced with "first surface," the term "first surface" may be replaced with "main surface," the term "back surface" may be replaced with "second surface," and the term "second surface" may be replaced with "back surface."

FIG. 1 is a schematic explanatory view for illustrating plane directions and crystal planes in the crystal structure of the Group-III element nitride semiconductor substrate according to the embodiment of the present invention. In the crystal structure illustrated in FIG. 1, a <0001> direction is a c-axis direction, a <1-100> direction is an m-axis direction, and a <11-20> direction is an a-axis direction. The top surface of a hexagonal crystal that may be regarded as a regular hexagonal prism is a c-plane, and a side wall surface of the regular hexagonal prism is an m-plane.

Figure 2:
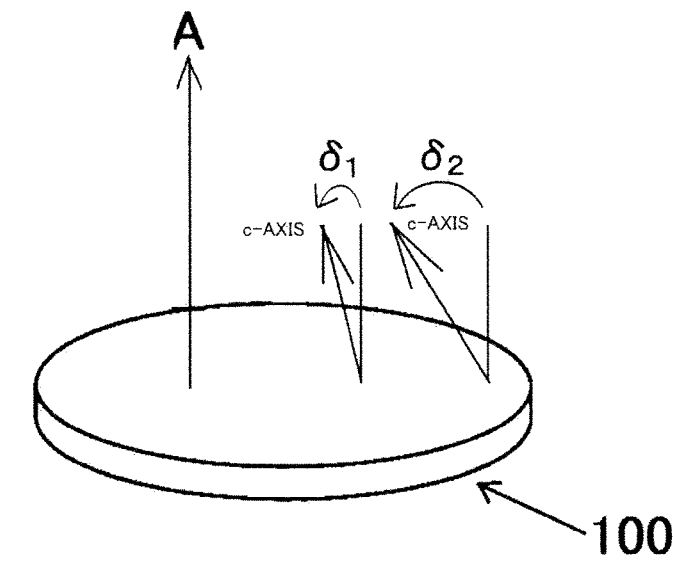
FIG. 2 is a typical schematic perspective view of the Group-III element nitride semiconductor substrate according to the embodiment of the present invention.

FIG. 2 is a typical schematic perspective view of a Group-III element nitride semiconductor substrate 100 according to the embodiment of the present invention. As illustrated in FIG. 2, in the Group-III element nitride semiconductor substrate 100 according to the embodiment of the present invention, a c-axis (<0001> direction) is tilted with respect to a normal vector A of its first surface. That is, the Group-III element nitride semiconductor substrate 100 according to the embodiment of the present invention has an off angle δ, which is the tilt angle of the c-axis (<0001> direction) with respect to the normal vector A of the first surface. The off angle δ may fluctuate depending on a crystal state at the place of the c-axis in the first surface. In a conventional Group-III element nitride semiconductor substrate, in general, as illustrated in FIG. 2, the off angle fluctuates with increased closeness to the outer peripheral portion of the substrate away from the vicinity of the center of the first surface (an off angle $δ_1$ and an off angle $δ_2$ in FIG. 2), and as a result, an off-angle variation is generated in the case of seeing the first surface as a whole.

The cause by which, in the conventional Group-III element nitride semiconductor substrate, in general, an off-angle variation is generated in the case of seeing the first surface as a whole is conceived to be as described below.

Figure 3:
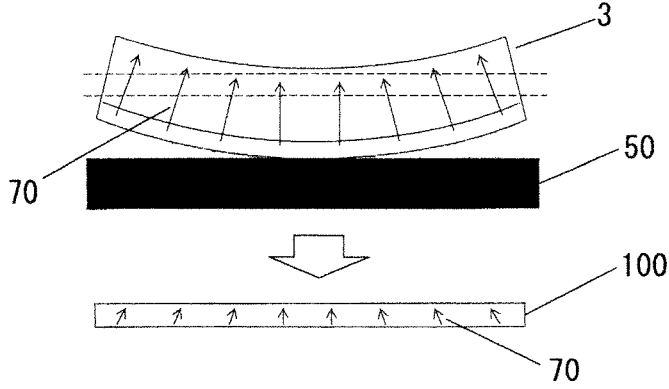
FIG. 3 is a typical schematic sectional view for illustrating a step of subjecting a Group-III element nitride layer to flattening processing to provide a flat Group-III element nitride semiconductor substrate.

The Group-III element nitride semiconductor substrate is generally obtained as follows: a Group-III element nitride layer is grown and formed on a base substrate such as a sapphire substrate, the Group-III element nitride layer is separated from the base substrate by a laser lift-off (LLO) technology or the like, and the Group-III element nitride semiconductor substrate is obtained therefrom. In this case, the Group-III element nitride layer separated from the base substrate is often concavely warped owing to, for example, a stress distribution inside a Group-III element nitride crystal, and a dislocation density difference between the front and back of the Group-III element nitride layer. Here, the off angle of the base substrate has nearly the same value at any site on the substrate, and hence the off-angle variation is nearly uniform. Accordingly, also in the Group-III element nitride layer grown and formed thereon, under a state before its separation, the off angle is close to the off angle of the base substrate at any site on the surface of the layer, and hence the off-angle variation is nearly uniform. In addition, even when the Group-III element nitride layer is concavely warped by separating the Group-III element nitride layer from the base substrate, at any position on the surface of the layer, the normal vector of a tangent plane at that position fluctuates in conjunction with the warping. Accordingly, the off angle, which is the tilt angle of the c-axis (<0001> direction) with respect to the normal vector, is substantially unchanged from that before the warping, and hence the off-angle variation is nearly uniform. In this connection, in the case of obtaining the Group-III element nitride semiconductor substrate from the warped Group-III element nitride layer, as illustrated in FIG. 3, a warped Group-III element nitride layer 3 has conventionally been, for example, subjected to flattening processing with a surface plate 50 for processing to provide a flat Group-III element nitride semiconductor substrate 100. When the warped Group-III element nitride layer 3 is subjected to the flattening processing to provide the flat Group-III element nitride semiconductor substrate 100, the flattening processing eliminates the warping of the contour of the substrate itself. However, when a Group-III element nitride layer having a nearly uniform off-angle variation in a warped state is subjected to the flattening processing, as illustrated in FIG. 3, a region in which the off angle is shifted from the originally intended crystal direction is formed. The extent of the shift increases with increased closeness to the outer peripheral portion of the substrate, and hence an off-angle variation is generated in the case of seeing the first surface as a whole.

Meanwhile, when the flattening processing is performed with the warped Group-III element nitride layer being bonded, in a state of having its contour shape flattened, to the surface plate for processing in order to obtain the Group-III element nitride semiconductor substrate from the warped Group-III element nitride layer, there is a problem in that the deformation amount of the Group-III element nitride semiconductor substrate to be obtained may be increased, leading to breakage of the Group-III element nitride semiconductor substrate. The size of the contour shape of such warped Group-III element nitride layer increases in proportion to the square of its diameter, and hence the problem becomes particularly remarkable in a substrate having a large diameter of, for example, 4 inches or more.

When the off-angle variation in the Group-III element nitride semiconductor substrate is large as described above, there are a risk in that the surface morphology of a functional layer to be formed on the Group-III element nitride semiconductor substrate may be roughened, and a risk in that its function may fluctuate from place to place. For example, in the case of a light-emitting device, there occurs a problem in that a wavelength variation in the substrate is increased.

The Group-III element nitride semiconductor substrate according to the embodiment of the present invention is a Group-III element nitride semiconductor substrate in which the off-angle variation is small, and the off-angle variation of the Group-III element nitride semiconductor substrate as a whole is preferably 0.40° or less, more preferably 0.30° or less, still more preferably 0.20° or less, particularly preferably 0.10° or less, most preferably 0.06° or less. When the off-angle variation of the Group-III element nitride semiconductor substrate according to the embodiment of the present invention falls within the above-mentioned ranges, the risk in that the surface morphology of the functional layer to be formed on the Group-III element nitride semiconductor substrate may be roughened is reduced, and the risk in that its function may fluctuate from place to place is reduced.

In the Group-III element nitride semiconductor substrate according to the embodiment of the present invention, the warping of the crystal plane of the first surface has a plurality of extremes. By virtue of the warping of the crystal plane of the first surface having a plurality of extremes as just described, the fluctuation of the extent of the shift of the off angle from the originally intended crystal direction in the first surface as a whole can be reduced to reduce the off-angle variation.

Figure 4:
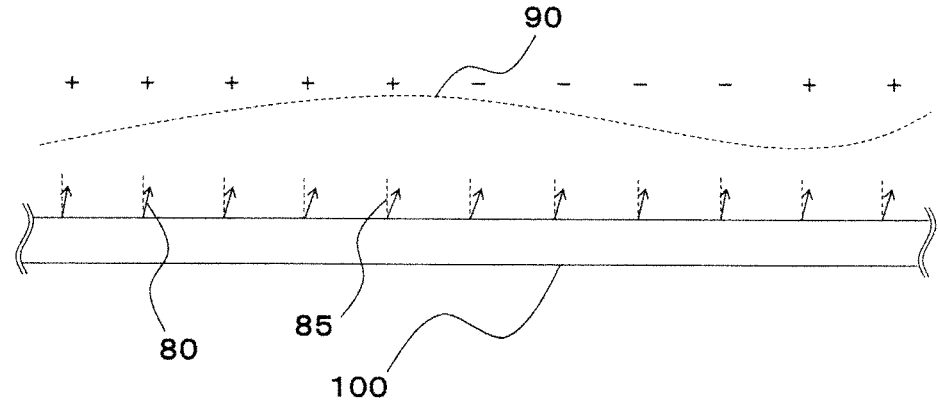
FIG. 4 is a typical schematic sectional view of the Group-III element nitride semiconductor substrate according to the embodiment of the present invention.

FIG. 4 is a typical schematic sectional view of the Group-III element nitride semiconductor substrate according to the embodiment of the present invention. Arrows 80 each represent any one of a component $\delta_a$ in the <11-20> direction (a-axis direction) of the off angle $\delta$ measured on the surface of the Group-III element nitride semiconductor substrate 100 according to the embodiment of the present invention and a component $\delta_m$ thereof in the <1-100> direction (m-axis direction) perpendicular to the <11-20> direction. Broken lines 85 each represent a normal line on the surface of the substrate, a curve 90 is a schematic representation of an approximate curve of the off angle in the <11-20> direction or the <1-100> direction, and "+" and "−" each represent the sign of a differential coefficient at each off angle measurement point.

In the present invention, the "extremes" of the warping of the crystal plane of the first surface are defined as follows. First, the tilt angle of the c-axis (<0001> direction) with respect to the normal vector A of the first surface is defined as the off angle $\delta$. The component of the off angle $\delta$ in the <11-20> direction (a-axis direction) is represented by $\delta_a$, and the component thereof in the <1-100> direction (m-axis direction) perpendicular to the <11-20> direction is represented by $\delta_m$. The off angle may be measured by an X-ray diffraction method. With regard to measurement coordinates, measurement is performed from an end of the substrate to the opposite end of the substrate at intervals of 2 mm in each of a direction parallel to the <11-20> direction (a-axis direction) passing through the center of the substrate and the <1-100> direction (m-axis direction) perpendicular to the above-mentioned direction and passing through the center of the substrate. However, a region within 3 mm from each end of the substrate is excluded. On the basis of respective plots of $\delta_a$ at the measurement coordinates and $\delta_m$ at the measurement coordinates, respective approximate curves are each drawn using a spline curve. Then, a differential coefficient at each measurement point is determined, and a case in which the positive/negative sign of the differential coefficient changes from positive to negative, or from negative to positive between adjacent coordinates is defined as having one extreme. Herein, the "center of the substrate" refers to the center of the maximum possible length on the substrate.

In the Group-III element nitride semiconductor substrate according to the embodiment of the present invention, it is preferred that warping of a crystal plane in the <11-20> direction passing through the center of the substrate in the crystal plane of the first surface, and warping of a crystal plane in the <1-100> direction perpendicular to the <11-20> direction and passing through the center of the substrate each have a plurality of extremes.

The number of "extremes" of the warping of the crystal plane of the first surface is preferably 3 or more, more preferably from 3 to 100, still more preferably from 3 to 50, still more preferably from 3 to 30, particularly preferably from 3 to 20, most preferably from 3 to 18.

In the Group-III element nitride semiconductor substrate according to the embodiment of the present invention, the "extremes" of the warping of the crystal plane of the first surface have an interval between adjacent extremes of preferably 3 mm or more, more preferably 5 mm or more, still more preferably 8 mm or more, particularly preferably from 12 mm to (R/4) mm, where R (mm) represents the diameter of the substrate. When, in the Group-III element nitride semiconductor substrate according to the embodiment of the present invention, the interval between adjacent extremes falls within the above-mentioned ranges, the risk in that the surface morphology of the functional layer to be formed on the Group-III element nitride semiconductor substrate may be roughened is reduced, and the risk in that its function may fluctuate from place to place is reduced.

Figure 5:
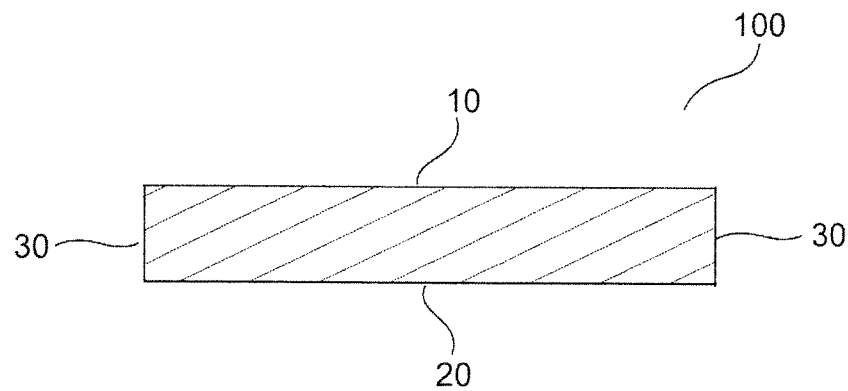
FIG. 5 is a typical schematic sectional view of the Group-III element nitride semiconductor substrate according to the embodiment of the present invention.

FIG. 5 is a typical schematic sectional view of the Group-III element nitride semiconductor substrate according to the embodiment of the present invention. As illustrated in FIG. 5, the Group-III element nitride semiconductor substrate 100 according to the embodiment of the present invention typically has a main surface (Group-III element polar surface) 10 and a back surface (nitrogen polar surface) 20. The Group-III element nitride semiconductor substrate 100 according to the embodiment of the present invention may have a side surface 30.

An end portion of the Group-III element nitride semiconductor substrate according to the embodiment of the present invention may adopt any appropriate form to the extent that the effect of the present invention is not impaired. Examples of the shape of the end portion of the Group-III element nitride semiconductor substrate according to the embodiment of the present invention include: a shape in which chamfered portions on a main surface side and on a back surface side are each chamfered so as to be a flat surface; a shape in which the chamfered portions on the main surface side and on the back surface side are each chamfered in an R-shape; a shape in which only the chamfered portion on the main surface side of the end portion is chamfered so as to be a flat surface; and a shape in which only the chamfered portion on the back surface side of the end portion is chamfered so as to be a flat surface.

When the end portion of the Group-III element nitride semiconductor substrate according to the embodiment of the present invention is chamfered, the chamfered portion may be arranged over the one entire round of an outer peripheral portion, or may be arranged only in part of the outer peripheral portion.

The Group-III element nitride semiconductor substrate according to the embodiment of the present invention may be produced by any appropriate method to the extent that the effect of the present invention is not impaired. In terms of expressing the effect of the present invention to a larger extent, a preferred method of producing the Group-III element nitride semiconductor substrate according to the embodiment of the present invention is described below.

Figure 6A:
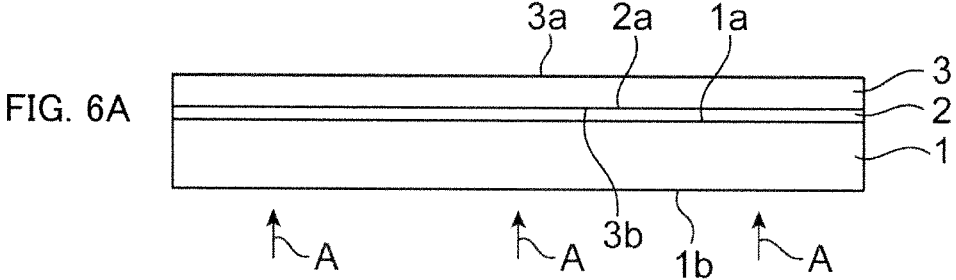
FIGS. 6A to 6C are schematic explanatory views for illustrating a method of producing the Group-III element nitride semiconductor substrate according to the embodiment of the present invention.
Figure 6B:
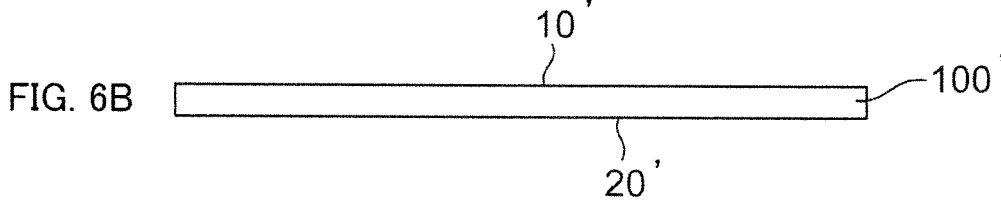

In the production of the Group-III element nitride semiconductor substrate according to the embodiment of the present invention, typically, as illustrated in FIG. 6A, a seed crystal film 2 is formed on a main surface 1a of a base substrate 1, and a Group-III element nitride layer 3 is formed on a Group-III element polar surface 2a of the seed crystal film 2. Next, a Group-III element nitride layer (seed crystal film 2+Group-III element nitride layer 3) serving as a freestanding substrate is separated from the base substrate 1 to provide a freestanding substrate 100' having a main surface 10' and a back surface 20'.

Any appropriate material may be adopted as a material for the base substrate to the extent that the effect of the present invention is not impaired. Examples of such material include sapphire, crystal oriented alumina, gallium oxide, $Al_xGa_{1-x}N$ ($0 \le x \le 1$), GaAs, SiC, silicon, a MgO single crystal, a ZnO single crystal, spinel ($MgAl_2O_4$) $LiAlO_2$, $LiGaO_2$, and perovskite-type complex oxides, such as $LaAlO_3$, $LaGaO_3$, and $NdGaO_3$. In addition, a composite oxide having a cubic perovskite structure represented by the compositional formula $[A_{1-y}(Sr_{1-x}Ba_x)_y][Al_{1-z}Ga_z)_{1-u}·D_u]O_3$ (where A represents a rare-earth element, D represents one or more kinds of elements selected from the group consisting of: niobium; and tantalum, y=0.3 to 0.98, x=0 to 1, z=0 to 1, u=0.15 to 0.49, and x+z=0.1 to 2) may be used. In addition, SCAM (ScAlMgO₄) may be used.

Any appropriate material may be adopted as a material for the seed crystal film to the extent that the effect of the present invention is not impaired. Examples of such material include $Al_xGa_{1-x}N$ ($0 \le x \le 1$) and $In_xGa_{1-x}N$ ($0 \le x \le 1$). Of those, gallium nitride is preferred. The material for the seed crystal film is more preferably gallium nitride that is recognized to show a yellow luminescence effect when observed with a fluorescence microscope. The term "yellow luminescence" refers to a peak (yellow luminescence (YL) or a yellow band (YB)) appearing in the range of from 2.2 eV to 2.5 eV in addition to an exciton transition (UV) from a band to another band.

Any appropriate formation method may be adopted as a method of forming the seed crystal film to the extent that the effect of the present invention is not impaired. Such formation method is, for example, a vapor growth method, and preferred examples thereof include a metal-organic chemical vapor deposition (MOCVD) method, a hydride vapor phase epitaxy (HVPE) method, a pulsed excitation deposition (PXD) method, a MBE method, and a sublimation method. Of those, a metal-organic chemical vapor deposition (MOCVD) method is more preferred as the method of forming the seed crystal film.

The formation of the seed crystal film by the MOCVD method is preferably performed by, for example, depositing a low-temperature grown buffer layer by from 20 nm to 50 nm at from 450° C. to 550° C., and then growing a film having a thickness of from 2 μm to 4 μm at from 1,000° C. to 1,200° C.

Any appropriate growth direction may be adopted as the growth direction of a Group-III element nitride crystal layer to the extent that the effect of the present invention is not impaired. Examples of such growth direction include: the normal direction of the c-plane of a wurtzite structure; the normal direction of each of the a-plane and m-plane thereof; and the normal direction of a plane tilted from each of the c-plane, the a-plane, and the m-plane.

Any appropriate formation method having a crystal direction substantially following the crystal direction of the seed crystal film may be adopted as a method of forming the Group-III element nitride crystal layer to the extent that the effect of the present invention is not impaired. Examples of such formation method include: gas phase growth methods, such as a metal-organic chemical vapor deposition (MOCVD) method, a hydride vapor phase epitaxy (HVPE) method, a pulsed excitation deposition (PXD) method, a MBE method, and a sublimation method; liquid phase growth methods, such as a Sodium flux method, an ammonothermal method, a hydrothermal method, and a sol-gel method; a powder growth method utilizing solid phase growth of powder; and a combination thereof.

When the Sodium flux method is adopted as the method of forming the Group-III element nitride crystal layer, the Sodium flux method is preferably performed in conformity with a production method described in JP 5244628 B2 by appropriately adjusting the conditions and the like so that the effect of the present invention can be expressed to a larger extent.

Next, the freestanding substrate including the Group-III element nitride crystal layer may be obtained by separating the Group-III element nitride crystal layer from the base substrate.

Any appropriate method may be adopted as a method of separating the Group-III element nitride crystal layer from the base substrate to the extent that the effect of the present invention is not impaired. Examples of such method include: a method including spontaneously separating the Group-III element nitride crystal layer from the base substrate through use of a thermal shrinkage difference in a temperature decrease step after the growth of the Group-III element nitride crystal layer; a method including separating the Group-III element nitride crystal layer from the base substrate through chemical etching; a method including peeling the Group-III element nitride crystal layer from the base substrate by a laser lift-off method including applying laser light from a back surface 1*b* side of the base substrate 1 as indicated by the arrows A, as illustrated in FIG. 6A; and a method of peeling the Group-III element nitride crystal layer from the base substrate through grinding. In addition, the freestanding substrate including the Group-III element nitride crystal layer may be obtained by slicing the Group-III element nitride crystal layer through utilization of a wire saw or the like.

Next, the freestanding substrate is shaped into a circular shape having a desired diameter by grinding its outer peripheral portion.

Any appropriate size may be adopted as the size of the freestanding substrate to the extent that the effect of the present invention is not impaired. Such size is, for example, from 20 mm to 30 mm (about 1 inch), from 45 mm to 55 mm (about 2 inches), from 95 mm to 105 mm (about 4 inches), from 145 mm to 155 mm (about 6 inches), from 195 mm to 205 mm (about 8 inches), or from 295 mm to 305 mm (about 12 inches).

Next, the nitrogen polar surface of the freestanding substrate of a circular shape is bonded to a surface plate for processing. At the time of the bonding, the surface shape of the freestanding substrate is changed by: changing the thickness of a wax through the adjustment of a load to be applied to the freestanding substrate; interposing a jig between the freestanding substrate and the surface plate for processing; or using a surface plate for processing whose surface has been processed into a desired substrate surface shape.

In order to obtain the Group-III element nitride semiconductor substrate according to the embodiment of the present invention, at the time of the bonding of the nitrogen polar surface of the freestanding substrate of a circular shape to the surface plate for processing, there is adopted means for forming, on the nitrogen polar surface of the freestanding substrate, such a plurality of convex/concave that the off-angle variation of the Group-III element polar surface of the freestanding substrate becomes preferably 0.40° or less (more preferably 0.30° or less, still more preferably 0.20° or less, particularly preferably 0.10° or less, most preferably 0.06° or less). Examples of such means include: a method involving interposing a spacer between the nitrogen polar surface of the freestanding substrate and the surface plate for processing; and a method involving providing convex/concave on the surface of the surface plate for processing opposed to the nitrogen polar surface of the freestanding substrate.

Any appropriate spacer may be adopted as the spacer to the extent that the effect of the present invention is not impaired. From the standpoint that the effect of the present invention can be expressed to a larger extent, examples of such spacer include metal foil (e.g., aluminum foil), paper, medicine paper (paraffin paper), an ultrafine wire, a resin (e.g., a silicon sheet), and a low adhesion tape. The spacers may be used alone or in combination thereof.

Any appropriate shape may be adopted as the shape of the spacer to the extent that the effect of the present invention is not impaired. Such shape is preferably a circular ring shape (toroidal shape) or a strip shape, more preferably a circular ring shape (toroidal shape) because the effect of the present invention can be expressed to a larger extent. In addition, with regard to the number of spacers to be used, one spacer may be used, or a plurality of spacers may be used. When one spacer is used, any appropriate arrangement position may be adopted as its arrangement position to the extent that the effect of the present invention is not impaired. From the standpoint that the effect of the present invention can be expressed to a larger extent, such arrangement position is as follows: the spacer is preferably arranged so that its center of gravity is as close to the center of the substrate as possible. When a plurality of spacers are used, any appropriate arrangement positions may be adopted as their arrangement positions to the extent that the effect of the present invention is not impaired. From the standpoint that the effect of the present invention can be expressed to a larger extent, such arrangement positions are as follows: when the shape of each of the spacers is a circular ring shape (toroidal shape), the plurality of spacers are preferably arranged on concentric circles whose center is the center of the substrate so that the center of gravity of the plurality of spacers is as close to the center of the substrate as possible; and when the shape of each of the spacers is a strip shape, the plurality of spacers are preferably arranged in a stripe pattern or a lattice pattern at equal intervals.

In terms of the size of the spacer, any appropriate spacer may be adopted to the extent that the effect of the present invention is not impaired, and to the extent that cracks do not occur in the substrate during processing.

Next, the main surface and/or the back surface is subjected to removal processing by surface processing, such as grinding, lapping, or polishing, to thereby provide a freestanding substrate turned into a thin plate having a desired thickness and flattened.

When the surface processing, such as grinding, lapping, or polishing, is performed, the freestanding substrate is generally bonded to a surface plate for processing, for example, through use of a wax. At this time, a bonding pressure of the freestanding substrate to the surface plate for processing, specifically, a pressure applied to the freestanding substrate at the time of the bonding of the freestanding substrate to the surface plate for processing is appropriately adjusted.

The thickness of the freestanding substrate after the polishing (when the thickness is not constant, the thickness of a site having the largest thickness) is preferably from 300 μm to 1,000 μm.

The outer peripheral edge of the freestanding substrate is chamfered through grinding as required. When an affected layer remains on the surface of the main surface, the affected layer is substantially removed. In addition, when a residual stress resulting from the affected layer remains on the surface of the back surface, the residual stress is removed. Finally, the Group-III element nitride semiconductor substrate 100 according to the embodiment of the present invention is obtained.

In the production of the Group-III element nitride semiconductor substrate according to the embodiment of the present invention, the chamfering may be performed by any appropriate chamfering method to the extent that the effect of the present invention is not impaired. Examples of such chamfering method include: grinding with diamond abrasive grains; polishing with a tape; and chemical mechanical polish (CMP) with a slurry such as colloidal silica and a polishing pad made of a nonwoven fabric.

Figure 6C:
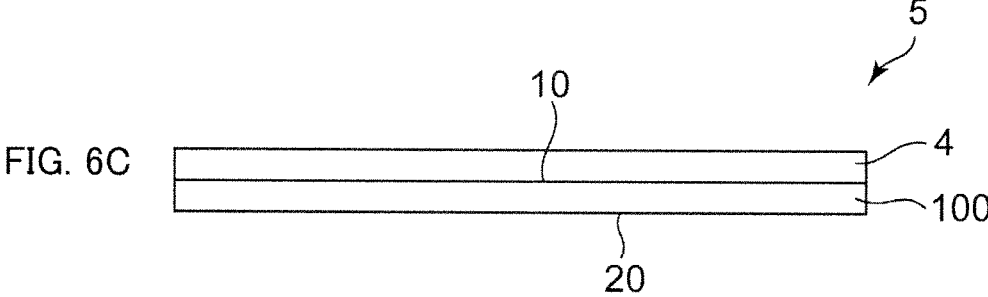

A crystal can be epitaxially grown on the main surface (Group-III element polar surface) 10 of the Group-III element nitride semiconductor substrate 100 to be obtained, and the formation of a functional layer 4 as illustrated in FIG. 6C provides a functional element 5. Reference numeral 20 represents the back surface (nitrogen polar surface) of the substrate.

The epitaxial crystal to be grown on the Group-III element nitride semiconductor substrate to be obtained may be, for example, gallium nitride, aluminum nitride, indium nitride, or a mixed crystal thereof. Specific examples of such epitaxial crystal include GaN, AlN, InN, $Ga_xAl_{1-x}N$ (1>x>0), $Ga_xIn_{1-x}N$ (1>x>0), $Al_xIn_{1-x}N$ (1>x>0), and $Ga_xAl_yIn_zN$ (1>x>0, 1>y>0, x+y+z=1). In addition, examples of the functional layer to be arranged on the Group-III element nitride semiconductor substrate to be obtained include a rectifying element layer, a switching element layer, and a power semiconductor layer in addition to a light-emitting layer. In addition, the thickness and total thickness variation of the freestanding substrate may be reduced by subjecting the nitrogen polar surface to processing, such as grinding or polishing, after the arrangement of the functional layer on the Group-III element polar surface of the Group-III element nitride semiconductor substrate to be obtained.

EXAMPLES

The present invention is specifically described below by way of Examples. However, the present invention is by no means limited to Examples. Test and evaluation methods in Examples and the like are as described below. The term "part(s)" in the following description means "part(s) by weight" unless otherwise specified, and the term "%" in the following description means "wt %" unless otherwise specified.

<Measurement of Off Angle δ>

Measurement was performed with an energy-dispersive X-ray diffractometer (manufactured by Bruker AXS, D2 CRYSO).

An off angle δ is the tilt angle of a c-axis (<0001> direction) with respect to the normal vector in the Group-III element polar surface of a Group-III element nitride semiconductor substrate. The component of the off angle δ in a <11-20> direction (a-axis direction) is represented by $δ_a$, and the component thereof in a <1-100> direction (m-axis direction) perpendicular to the <11-20> direction is represented by $δ_m$.

<Measurement of Off-Angle Variation Distribution>

For the component $δ_a$ of the measured off angle δ in the <11-20> direction (a-axis direction) and the component $δ_m$ thereof in the <1-100> direction (m-axis direction) perpendicular to the <11-20> direction, on the basis of respective plots of Sa at the measurement coordinates and $δ_m$ at the measurement coordinates, respective approximate curves were each drawn using a spline curve. Then, a differential coefficient at each measurement point was determined, and a case in which the positive/negative sign of the differential coefficient changed from positive to negative, or from negative to positive between adjacent coordinates was defined as having one extreme. Then, a difference between the maximum value and minimum value of $δ_a$ measured, and a difference between the maximum value and minimum value of $δ_m$ measured were compared, and the larger value was adopted as an off-angle variation.

<Observation of Surface Morphology>

For observation of surface morphology, the surface of the Group-III element polar surface at the same coordinates as in the off angle measurement was observed using a differential interference contrast microscope (manufactured by Nikon Corporation, model number: LV100ND) with a 10× objective lens and a 10× ocular lens.

The form of the surface morphology depends on the off angle, and when the off angle is close to zero degrees, a flat surface is observed with no characteristic pattern. As the off angle increases, a step pattern resulting from the step-flow growth of a Group-III nitride crystal starts to be observed, and a step interval gradually widens. Whatever the off angle may be, it is important from the viewpoints of the characteristics of a device to be produced that the off angle be uniform within an observation field of view. Meanwhile, large waviness having a wavy form, bunching, and hillocks are undesirable from the viewpoints of the characteristics of a device to be produced, and hence such surface morphology was judged abnormal.

Example 1

A gallium nitride template (2 μm thick gallium nitride layer/sapphire substrate, substrate diameter=110 mm) was produced as a seed crystal substrate by a MOCVD method.

The resultant seed crystal substrate was arranged in an alumina crucible in a glove box under a nitrogen atmosphere.

Next, metal gallium and metal sodium were loaded into the crucible so that the following ratio was obtained: Ga/(Ga+Na) (mol %)=15 mol %. The crucible was loaded into a container made of a heat resistant metal, and the container was then placed on a table on which a crystal growing furnace was able to be rotated. After the temperature and pressure of the crystal growing furnace were increased to 870° C. and 4.0 MPa, respectively, while this state was retained for 100 hours, a solution was stirred by rotating the container, to thereby grow a crystal. After that, annealing was performed to room temperature, and the pressure was reduced to atmospheric pressure. After that, the growing container was taken out from the crystal growing furnace.

Solidified metal sodium in the crucible was removed by being washed with an alcohol. Thus, a gallium nitride crystal layer (thickness: 1 mm) without cracks was obtained on the seed crystal substrate.

The base substrate was peeled to separate the gallium nitride crystal layer by a laser lift-off (LLO) method, to thereby provide a gallium nitride freestanding substrate.

The gallium nitride freestanding substrate was shaped into a circular shape having a diameter of 100 mm by grinding the outer peripheral portion of the gallium nitride freestanding substrate.

A wax, one sheet of aluminum foil (thickness: 0.01 mm, shape: circular ring shape (toroidal shape), outermost diameter: 70 mm in diameter, ring width: 20 mm) serving as a spacer, the resultant gallium nitride freestanding substrate, and a silicone sheet having a diameter of 110 mm and a thickness of 2 mm were placed in the stated order on a ceramic-made surface plate for processing having a flat surface, and a load was applied to the entirety of the substrate. The spacer was arranged so that the center of the ring and the center of the substrate coincided with each other. A pressure to be applied was set to 1.5 MPa. Then, the Ga polar surface of the substrate was ground and lapped. The resultant surface was subjected to surface processing serving as final finish with diamond abrasive grains each having a grain diameter of 0.1 μm, and then an affected layer was removed through RIE.

Next, the freestanding substrate in which the Ga polar surface had been processed was reversed and fixed to the ceramic-made surface plate for processing with a wax without any spacer inserted between the surface plate for processing and the freestanding substrate, and the nitrogen polar surface thereof was ground and lapped. The resultant surface was subjected to mirror finish serving as final finish with diamond abrasive grains each having a grain diameter of 0.1 μm, and then an affected layer was removed through RIE.

Thus, a wafer (1) serving as a gallium nitride freestanding substrate was produced.

The wafer (1) had a thickness of 500 μm.

The off angle in the Ga polar surface of the resultant freestanding substrate was evaluated. Next, an LED element structure was grown as an epitaxial film on the Ga polar surface of the freestanding substrate by a MOCVD method, and the surface morphology was evaluated.

The results are shown in Table 1.

Example 2

A wafer (2) serving as a gallium nitride freestanding substrate was produced in the same manner as in Example 1 except that the number of spacers was two; the shapes of the two spacers were circular ring shapes (toroidal shapes) having different diameters, the diameters being 35 mm and 85 mm, respectively, and a common ring width of 10 mm; and the two spacers were placed on nearly concentric circles whose center was the center of the substrate, and were arranged so that the center of gravity of the two spacers coincided with the center of the substrate.

The wafer (2) had a thickness of 500 μm.

The off angle in the Ga polar surface of the resultant freestanding substrate was evaluated. Next, an LED element structure was grown as an epitaxial film on the Ga polar surface of the freestanding substrate by a MOCVD method, and the surface morphology was evaluated.

The results are shown in Table 1.

Example 3

A wafer (3) serving as a gallium nitride freestanding substrate was produced in the same manner as in Example 1 except that the number of spacers was three; the shapes of the three spacers were circular ring shapes (toroidal shapes) having different diameters, the diameters being 23 mm, 56 mm, and 90 mm, respectively, and a common ring width of 6 mm; and the three spacers were placed on nearly concentric circles whose center was the center of the substrate, and were arranged so that the center of gravity of the three spacers coincided with the center of the substrate.

The wafer (3) had a thickness of 500 μm.

The off angle in the Ga polar surface of the resultant freestanding substrate was evaluated. Next, an LED element structure was grown as an epitaxial film on the Ga polar surface of the freestanding substrate by a MOCVD method, and the surface morphology was evaluated.

The results are shown in Table 1.

Example 4

A wafer (4) serving as a gallium nitride freestanding substrate was produced in the same manner as in Example 1 except that the number of spacers was four; the shapes of the four spacers were circular ring shapes (toroidal shapes) having different diameters, the diameters being 17 mm, 42 mm, 67 mm, and 92 mm, respectively, and a common ring width of 5 mm; and the four spacers were placed on nearly concentric circles whose center was the center of the substrate, and were arranged so that the center of gravity of the four spacers coincided with the center of the substrate.

The wafer (4) had a thickness of 500 μm.

The off angle in the Ga polar surface of the resultant freestanding substrate was evaluated. Next, an LED element structure was grown as an epitaxial film on the Ga polar surface of the freestanding substrate by a MOCVD method, and the surface morphology was evaluated.

The results are shown in Table 1.

Example 5

A wafer (5) serving as a gallium nitride freestanding substrate was produced in the same manner as in Example 1 except that the number of spacers was five; the shapes of the five spacers were circular ring shapes (toroidal shapes) having different diameters, the diameters being 14 mm, 34 mm, 54 mm, 74 mm, and 94 mm, respectively, and a common ring width of 4 mm; and the five spacers were placed on nearly concentric circles whose center was the center of the substrate, and were arranged so that the center of gravity of the five spacers coincided with the center of the substrate.

The wafer (5) had a thickness of 500 μm.

The off angle in the Ga polar surface of the resultant freestanding substrate was evaluated. Next, an LED element structure was grown as an epitaxial film on the Ga polar surface of the freestanding substrate by a MOCVD method, and the surface morphology was evaluated.

The results are shown in Table 1.

Example 6

Figure 7:
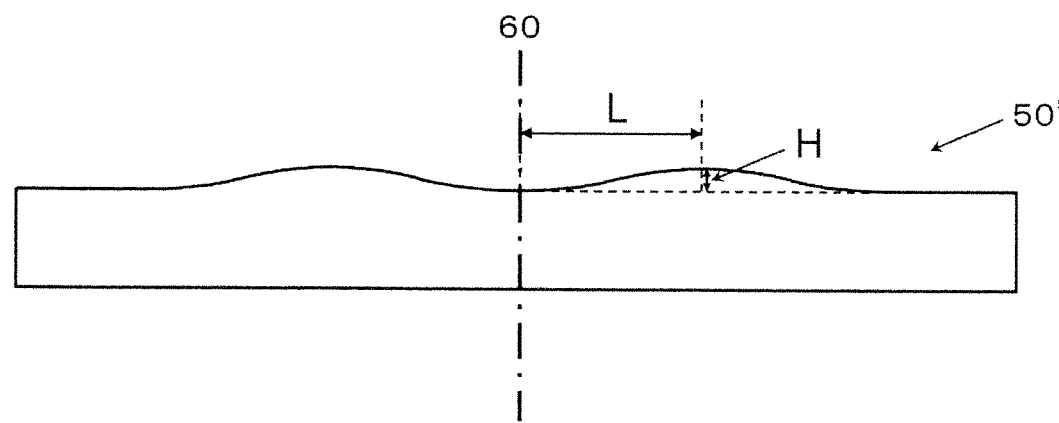
FIG. 7 is a schematic sectional view passing through the center of a ceramic-made surface plate for processing used in Example 6.

A wafer (6) serving as a gallium nitride freestanding substrate was produced in the same manner as in Example 1 except that no spacer was used, but instead, a ceramic-made surface plate for processing whose surface had been processed into such a sectional shape as illustrated in FIG. 7 (L=25 mm, H=0.03 mm) (the central axis of the surface plate for processing was an axis 60) was used.

The wafer (6) had a thickness of 500 μm.

The off angle in the Ga polar surface of the resultant freestanding substrate was evaluated. Next, an LED element structure was grown as an epitaxial film on the Ga polar surface of the freestanding substrate by a MOCVD method, and the surface morphology was evaluated.

The results are shown in Table 1.

Comparative Example 1

A wafer (C1) serving as a gallium nitride freestanding substrate was produced in the same manner as in Example 1 except that: no spacer was used; and the pressure at the time of the bonding to the surface plate for processing was changed to 0.01 MPa.

The wafer (C1) had a thickness of 500 μm.

The off angle in the Ga polar surface of the resultant freestanding substrate was evaluated. Next, an LED element structure was grown as an epitaxial film on the Ga polar surface of the freestanding substrate by a MOCVD method, and the surface morphology was evaluated.

The results are shown in Table 1.

Comparative Example 2

The same procedure as in Example 1 was performed except that no spacer was used. As a result, a crack occurred in the substrate at the time of the bonding to the surface plate for processing with the application of a load. Because of the occurrence of the crack, the subsequent steps were aborted.

TABLE 1

| | Number of | Number of extremes of warping of first surface | | Off-angle | Presence or absence of abnormality |
| | spac-ers | <11-20> direction | <1-100> direction | variation (°) | in surface morphology |
|---|---|---|---|---|---|
| Example 1 | 1 | 3 | 3 | 0.06 | Absent |
| Example 2 | 2 | 7 | 7 | 0.08 | Absent |
| Example 3 | 3 | 11 | 11 | 0.06 | Absent |
| Example 4 | 4 | 15 | 15 | 0.04 | Absent |
| Example 5 | 5 | 19 | 19 | 0.03 | Present |
| Example 6 | 0 | 3 | 3 | 0.21 | Absent |
| Comparative Example 1 | 0 | 1 | 1 | 0.43 | Absent |

The Group-III element nitride semiconductor substrate according to the embodiment of the present invention may be utilized as each of the substrates of various semiconductor devices.

What is claimed is:

1. A Group-III element nitride semiconductor substrate, comprising:

a first surface; and a second surface, wherein warping of a crystal plane of the first surface has a plurality of extremes.

2. The Group-III element nitride semiconductor substrate according to claim 1, wherein warping of a crystal plane in a <11-20> direction passing through a center of the substrate in the crystal plane of the first surface, and warping of a crystal plane in a <1-100> direction perpendicular to the <11-20> direction and passing through the center of the substrate each have a plurality of extremes.

3. The Group-III element nitride semiconductor substrate according to claim 1, wherein a number of the extremes is 3 or more.

4. The Group-III element nitride semiconductor substrate according to claim 1, wherein the extremes have an interval of 3 mm or more between adjacent extremes.

5. The Group-III element nitride semiconductor substrate according to claim 1, wherein an off-angle variation of the Group-III element nitride semiconductor substrate as a whole is 0.40° or less.

6. The Group-III element nitride semiconductor substrate according to claim 1, wherein the Group-III element nitride semiconductor substrate has a diameter of 75 mm or more.

7. A Group-III element nitride semiconductor substrate, comprising:

a first surface; and a second surface, wherein warping of a crystal plane in a <11-20> direction passing through a center of the substrate in the crystal plane of the first surface, and warping of a crystal plane in a <1-100> direction perpendicular to the <11-20> direction and passing through the center of the substrate each have 3 or more of extremes, wherein the extremes have an interval of 3 mm or more between adjacent extremes, wherein an off-angle variation of the Group-III element nitride semiconductor substrate as a whole is 0.40° or less, and wherein the Group-III element nitride semiconductor substrate has a diameter of 75 mm or more.

* * * * *